United States Patent
Schneider et al.

(10) Patent No.: US 12,188,119 B2
(45) Date of Patent: Jan. 7, 2025

(54) MAGNET SYSTEM AND SPUTTERING DEVICE

(71) Applicant: VON ARDENNE Asset GmbH & Co. KG, Dresden (DE)

(72) Inventors: Klaus Schneider, Arnsdorf (DE); Goetz Grosser, Dresden (DE); Thorsten Sander, Dresden (DE); Ralf Hauswald, Bad Schandau (DE)

(73) Assignee: VON ARDENNE Asset GmbH & CoKG, Dresden (DE)

(*) Notice: Subject to any disclaimer, the term of this patent is extended or adjusted under 35 U.S.C. 154(b) by 53 days.

(21) Appl. No.: 18/054,574

(22) Filed: Nov. 11, 2022

(65) Prior Publication Data
US 2023/0151477 A1    May 18, 2023

(30) Foreign Application Priority Data
Nov. 12, 2021   (DE) .................. 10 2021 129 524.6

(51) Int. Cl.
C23C 14/35 (2006.01)
H01F 7/02 (2006.01)

(52) U.S. Cl.
CPC .............. *C23C 14/35* (2013.01); *H01F 7/02* (2013.01)

(58) Field of Classification Search
CPC .. H01J 37/345; H01J 37/3455; H01J 37/3461; H01J 37/3405; C23C 14/354; H01F 7/02
USPC ....................... 204/298.21, 298.22
See application file for complete search history.

(56) References Cited

U.S. PATENT DOCUMENTS

| | | | |
|---|---|---|---|
| 7,824,528 B2 * | 11/2010 | Dellaert | H01J 37/3405 204/298.22 |
| 2004/0178056 A1 * | 9/2004 | De Bosscher | H01J 37/3461 204/298.22 |
| 2008/0047831 A1 | 2/2008 | Richert et al. | |
| 2011/0006022 A1 | 1/2011 | Caveney et al. | |

FOREIGN PATENT DOCUMENTS

DE    102014109991 A1    1/2016

OTHER PUBLICATIONS

German Search Report issued for the corresponding German patent applicaation No. 10 2021 129 524.6, dated Jul. 8, 2022, 6 pages (for informational purposes only).

* cited by examiner

*Primary Examiner* — Rodney G McDonald
(74) *Attorney, Agent, or Firm* — VIERING, JENTSCHURA & PARTNER MBB

(57) ABSTRACT

Disclosed herein are systems, methods, and devices related to a magnet system for a sputtering device. The magnet system includes a bearing frame and a magnet holder having a first mounting area and a second mounting area. The magnet system has a first support device mounted to the magnet holder by the first mounting area and a second support device mounted to the magnet holder by the second mounting area. At least one of the first mounting area and the second mounting area are configured such that a position in which the first support device and the second support device are mounted to the magnet holder relative to each other may be adjusted. The first support device and the second support device are configured to engage with the bearing frame to form a bearing device for supporting the magnet holder.

20 Claims, 10 Drawing Sheets

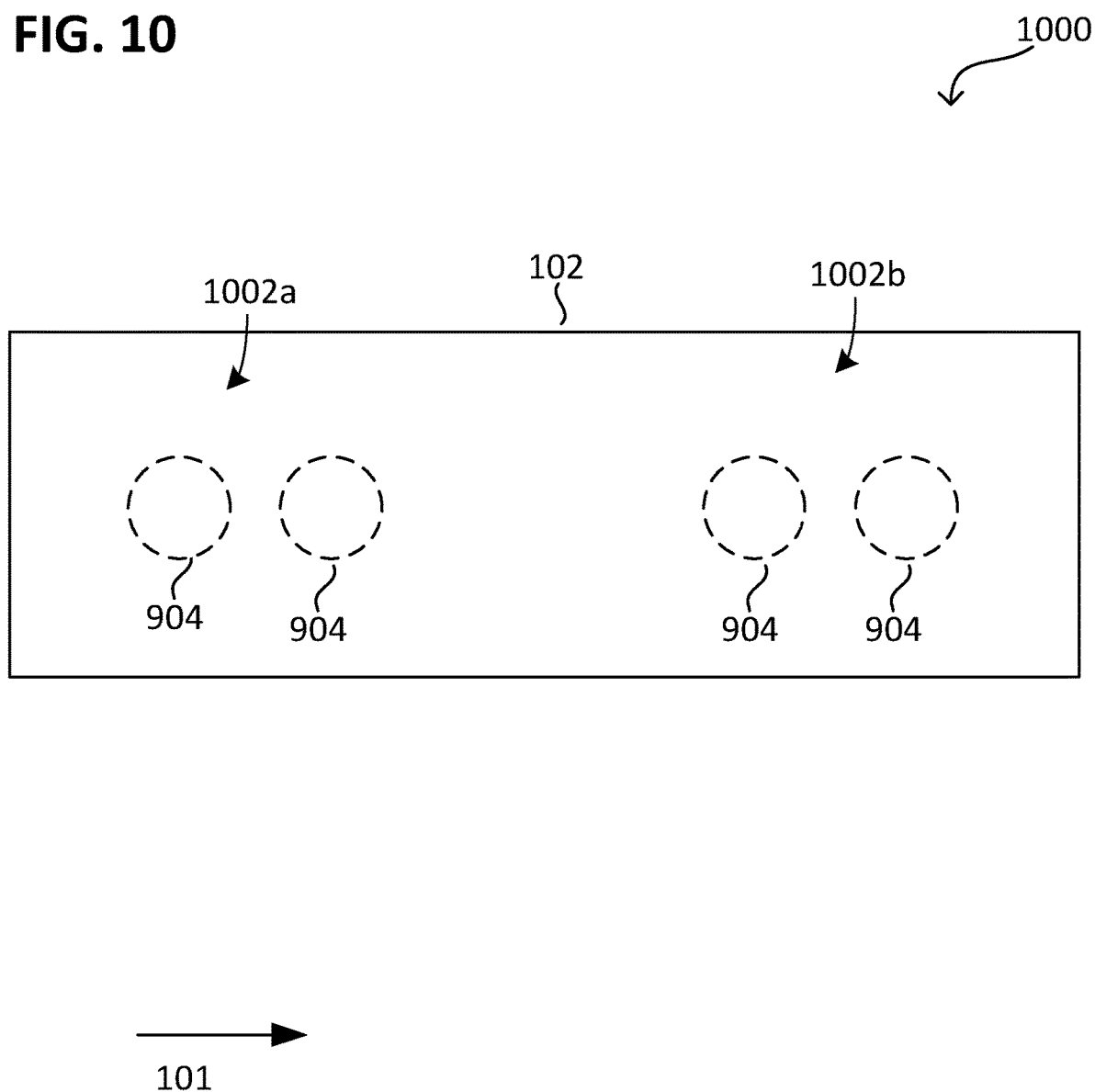

MAGNET SYSTEM AND SPUTTERING DEVICE

CROSS-REFERENCE TO RELATED APPLICATION(S)

This application claims priority to German Patent Application No. 10 2021 129 524.6, filed on Nov. 12, 2021, the contents of which are fully incorporated herein by reference.

TECHNICAL FIELD

Various embodiments relate to a magnet system and a sputtering device.

BACKGROUND

In general, workpieces or substrates may be processed, e.g., machined, coated, heated, etched, and/or structurally modified. For example, one process for coating a substrate is cathode sputtering (referred to as sputtering), which is of the physical vapor deposition (PVD) type. By means of sputtering (i.e. by means of a sputtering process), for example, one layer or plurality of layers may be deposited on a substrate. For this purpose, a plasma-forming gas may be ionized by means of a cathode, and a material to be deposited (target material) may be sputtered by means of the plasma formed in the process. The atomized target material may then be brought to a substrate on which it may be deposited and form a layer.

Modifications of cathode sputtering are sputtering by means of a magnetron, so-called magnetron sputtering, or so-called reactive magnetron sputtering. Here, the formation of the plasma may be supported by means of a magnetic field. To generate the magnetic field, a magnet system may be or be arranged on the target material or on the cathode (then also referred to as magnetron cathode), so that a toroidal plasma channel, a so-called racetrack, may be formed on the surface of the target material (target surface), in which plasma may be formed. In this process, the target material may be sputtered in the area (also referred to as the sputtering area) that is exposed to the plasma in the plasma channel. In reactive magnetron sputtering, the sputtered target material is additionally chemically reacted and a resulting reaction product is deposited as a layer on the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which:

FIGS. 4 to 10 show a magnet system according to different embodiments in different views.

DESCRIPTION

Figure 1:
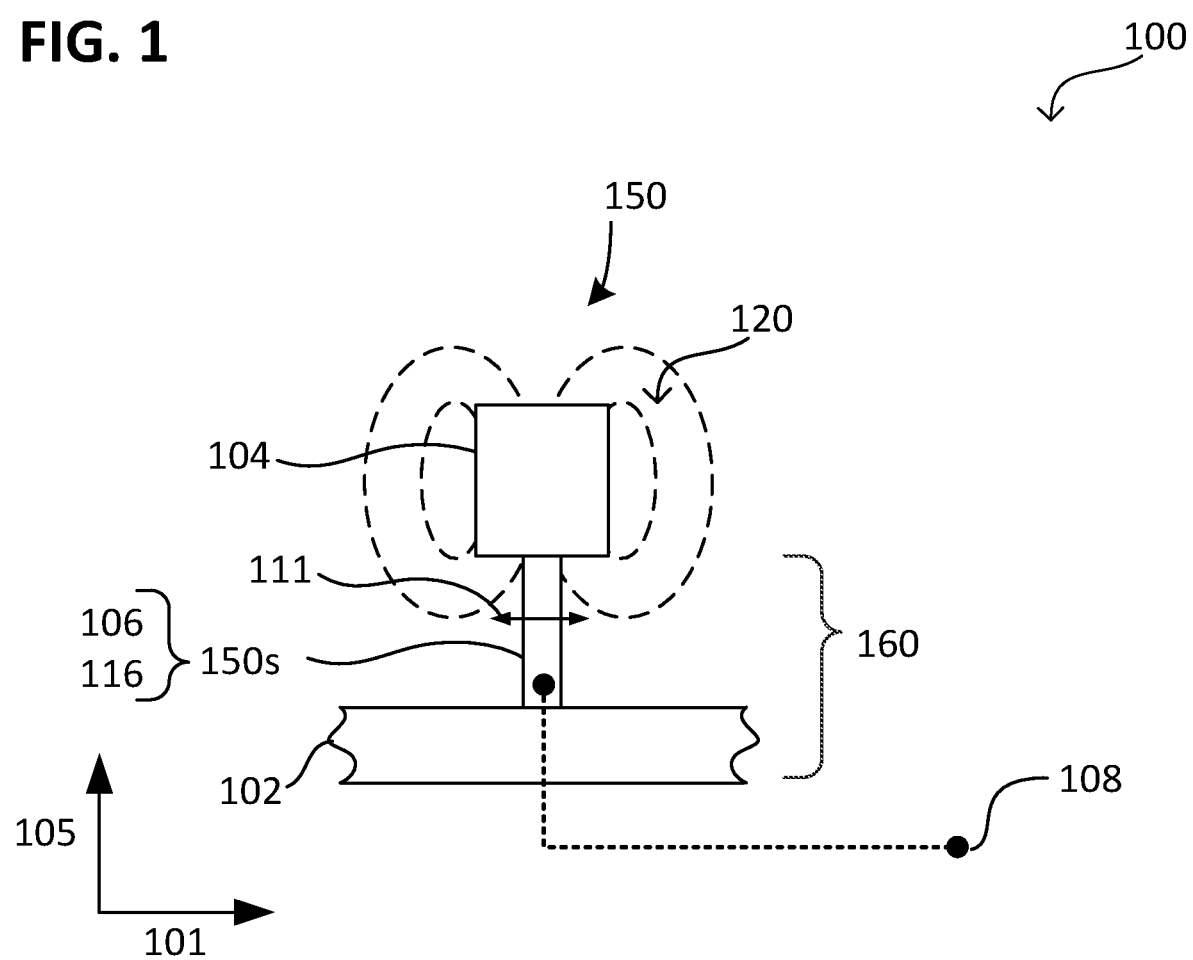
FIGS. 1 and 2 show a magnet system according to different embodiments in different views.

The following detailed description refers to the accompanying drawings that show, by way of illustration, exemplary details and features.

With respect to magnetic fields and sputtering, the spatial distribution of the plasma channel or the associated atomization rate depends very sensitively on the spatial distribution of the magnetic field. Therefore, the magnet system is of special importance with respect to various process properties, such as process stability, reproducibility, target utilization and homogeneity. Against this background, there is a fundamental need to improve the magnet system, for example to simplify it and/or to reduce disturbing influences.

According to various embodiments, it has been illustratively recognized that the deflection of the magnet system may be such a disturbing influence quantity. More specifically, the deflection of the magnet system is often greater than the deflection of the target. Because of this, as the target is consumed, the separation between the magnet system and the target changes along the length of the target, with the separation at the exact center being maximum or minimum depending on the direction of gravity.

A major component of a tubular magnetron is the magnet system, which generates the magnetic field (i.e. magnetfield) to form the racetrack. The strength of the magnetic field along the length of the tube target has a significant influence on the homogeneity of the deposited functional layer on the substrate. By varying the field strength in individual areas, the layer homogeneity may be specifically adjusted. For this reason, the magnet system is conventionally designed in such a way that the separation between magnet and target surface may be adjusted.

Since the adjustability of the height difference of the magnets is limited, an attempt is made to achieve the most homogeneous conditions possible for the magnet system and the environment, such as a homogeneous pressure distribution, which also has an influence on the homogeneity of the functional layer.

Other variations, such as the gravity-induced deflection of components such as tubes and carriers between the bearing points, may only be reduced to a limited extent in this way, however, since the separation of bearing points often cannot be selected without restriction and the factors influencing deflection (bending rigidity and dead weight) cannot be set at will. The pipe target may be mentioned here as an example. The support width of the bearing points (by means of the end blocks) is given by the substrate width. Between the end blocks, the target tube is cantilevered and will therefore deflect in the direction of gravity. For a carrier with a homogeneous mass distribution along its length, the deflection (v) is proportional to the specific mass (q) through the Young's modulus (E) times the area moment of inertia (I) according to the following relation:

$$v \sim qE*I.$$

The amount (e.g. thickness) of the target material has an influence on q and I, and the type of target material has an influence on q and E. The deflection of the target is thus a function of the type and amount of target material, with the amount of target material decreasing as it is consumed over time. The magnet system in the target tube, in turn, has a constant deflection over time between the bearing points, since under normal conditions the factors influencing the deflection remain unchanged. This results in a change in the relative position (e.g. the separation) between the magnet system and the target depending on the type of target material (e.g. when using different targets), the magnetic field strength as well as the consumption state of the target material.

According to various embodiments, a magnet system is provided that achieves that the deflection of the magnet system may be changed (e.g., adjusted to match the deflection of the target) or may at least be adjusted to set a change in distance (e.g., at the target tube ends) according to a specification. The magnet system provided may be used, for example, for a tube magnetron (e.g., for use in a PVD process).

In the following, reference is made to the accompanying drawings which form part thereof and in which are shown, for illustrative purposes, specific embodiments in which the invention may be practiced. In this regard, directional terminology such as "top", "bottom", "front", "rear", "forward", "rearward", etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various exemplary embodiments described herein may be combined, unless otherwise specifically indicated. Therefore, the following detailed description is not to be construed in a limiting sense, and the scope of protection is defined by the appended claims.

In the context of this description, the terms "connected", "attached" as well as "coupled" are used to describe both a direct and an indirect connection (e.g. ohmic and/or electrically conductive, e.g. an electrically conductive connection), a direct or indirect connection as well as a direct or indirect coupling. In the figures, identical or similar elements are given identical reference signs where appropriate.

According to various embodiments, the term "coupled" or "coupling" may be understood in the sense of a (e.g. mechanical, hydrostatic, thermal and/or electrical), e.g. direct or indirect, connection and/or interaction. For example, a plurality of elements may be coupled together along an interaction chain along which the interaction may be exchanged, e.g., a fluid (then also referred to as fluidically coupled). For example, two coupled elements may exchange an interaction with each other, e.g., a mechanical, hydrostatic, thermal, and/or electrical interaction. A coupling of a plurality of vacuum components (e.g., valves, pumps, chambers, etc.) to each other may have them fluidically coupled to each other. According to various embodiments, "coupled" may be understood in the sense of a mechanical (e.g., bodily or physical) coupling, e.g., by means of direct physical contact. A coupling may be configured to transmit a mechanical interaction (e.g., force, torque, etc.).

As used herein, the term "bearing device" means a device (for example, comprising an assembly) configured for bearing (e.g., guided positioning and/or holding) one or more than one component. The bearing device may comprise, for example per component (which is supported by means thereof), one or more than one bearing for supporting (e.g. guided positioning and/or holding) the component. Each bearing of the bearing device may be configured to provide the component with one or more than one degree of freedom (for example, one or more than one translational degree of freedom and/or one or more than one rotational degree of freedom) according to which the component may be moved. Examples of a bearing have: Radial bearing, thrust bearing, radial-axial bearing, linear bearing (also referred to as linear guide).

In some embodiments, a bearing device is provided that supports (e.g., holds) the component (e.g., a carrier) at a plurality of locations on the component (also referred to as bearing locations or bearing points), e.g., receiving a weight of the component at each of the bearing locations. Each of the plurality of bearing points may be provided by means of a (e.g., movable) support of the bearing device. A fixed bearing (i.e., immovable support) blocks all three translational degrees of freedom of the bearing location and optionally provides one or more than one rotational degree of freedom to the bearing location (i.e., allows one or more rotations of the bearing location). A floating bearing (i.e., movable support) provides at least one translational degree of freedom and optionally one more than one rotational degree of freedom to the bearing position, i.e., this blocks only one or two translational degrees of freedom (for example, the translational degree of freedom along the direction of gravity) of the bearing position.

The term "sputtering" refers to the atomization of a material (also referred to as coating material or target material), which is provided as a so-called target, by means of a plasma. The atomized components of the target material are thus separated from each other and may be deposited elsewhere, for example to form a layer. Sputtering may be performed by means of a so-called sputtering device, which may have a magnet system (in which case the sputtering device is also referred to as a magnetron). For sputtering, the magnetron may be placed in a vacuum processing chamber so that sputtering may be performed in a vacuum. To this end, the environmental conditions (the process conditions) within the vacuum processing chamber (e.g., pressure, temperature, gas composition, etc.) may be adjusted or controlled during sputtering. For example, the vacuum processing chamber may be or may be configured to be air-tight, dust-tight, and/or vacuum-tight, such that a gas atmosphere having a predefined composition or pressure (e.g., according to a set point) may be provided within the vacuum processing chamber. For example, an ion-forming gas (process gas) or a gas mixture (e.g., of a process gas and a reactive gas) may be or be provided within the vacuum processing chamber. In a reactive magnetron sputtering process, for example, the atomized material may react with a reactive gas (e.g., comprising oxygen, nitrogen, and/or carbon) and the resulting reaction product (e.g., a dielectric) may be deposited.

Sputtering may be performed by means of a so-called tubular magnetron, in which a tubular target (also referred to as a tube target or tubular cathode) rotates axially around the magnet system. The tube target may, for example, comprise a tube on which the target material may be fixed as a layer on an outer circumferential surface of the tube and may partially cover the circumferential surface of the tube. However, the tube target may also be formed from the target material. By adjusting the magnetic system or by changing the magnetic field generated thereby, the atomization of the target material and thus the spatial distribution with which the target is removed may be influenced.

The tubular cathode and magnet system may be supported by means of a bearing device (also referred to as a target bearing device) that rotatably supports the tubular cathode relative to the magnet system, for example. The bearing device may have, for example, one or more than one end block, each end block of the bearing device holding an end portion of the tubular cathode and magnet system, respectively. The bearing device (e.g., its one or more than one end block) may further provide a supply of electrical power, rotary motion, and/or cooling fluid to the tubular cathode. Optionally, the sputtering device, or bearing device thereof, may also be configured to hold two targets together with the magnet system disposed therein (also referred to as a double magnetron) when the sputtering device is configured in a double tube configuration.

According to various embodiments, an end block (then also referred to as a drive end block) of the sputtering device may include a drive train for transmitting rotational motion to the tubular cathode, which may be coupled to a drive, for example. Alternatively or additionally, an end block (also referred to as a media end block) of the sputtering device may be configured to supply and discharge cooling fluid (e.g., a water-based mixture) that may be passed through the cathode.

However, exactly one end block (also referred to as a compact end block) may be used, which has the drive train and fluid line and thus provides the functions of a drive end block and a media end block together. For example, the side of the tubular target opposite the compact end block may be freely cantilevered (i.e., freely suspended), which is referred to as a cantilever configuration. The compact end block may be mounted in cantilever configuration to a side wall of the vacuum chamber through which the axis of rotation of the tubular target extends. However, the side of the tube target opposite the compact end block may also be supported by means of a bearing block (illustratively a thrust bearing), which is referred to as a bearing block configuration. The bearing block may also be provided by means of a passive end block, i.e. an end block which does not exchange energy or material with the tube target, but only supports it.

According to various embodiments, the magnet system may have a length (extent along the longitudinal extent, longitudinal direction, and/or axis of rotation of the target) in a range from 0.5 m (meter) approximately to approximately 6 m, e.g., in a range from 2 m approximately to approximately 5 m and/or greater than 3 m.

The magnet system may be multipolar, i.e., have multiple magnetic poles. Of the plurality of magnetic poles, a first magnetic pole (also referred to as an outer pole) may extend along a self-contained path (also referred to as a circulatory path) and a second magnetic pole may be disposed within the area enclosed by the circulatory path (also referred to as an inner pole). The circulatory path may be oval-shaped, for example.

Each magnetic pole may have a plurality of pole bodies, e.g. magnets (then also referred to as a row of magnets or magnet row), lined up in series, each pole body being magnetized or having a magnetization. For example, each row of magnets may have at least 10 (e.g., at least 100) pole bodies, e.g., magnets, per meter. For example, each magnetic pole may have one or more than one magnetic row. For example, three rows of magnets arranged between the end pieces of the magnet system may provide substantially the center region of the magnet system (illustratively one row as the inner pole, one row of magnets on each side of the inner pole as the outer pole).

As used herein, the term "pole body" means a body having or formed from a magnetic material (also referred to as magnetic material). For example, the pole body may be adjacent to or part of a magnetic pole. The magnetic material may be, for example, ferromagnetic or ferrimagnetic. The magnet material may comprise or be formed from hard-magnetic magnet material and/or soft-magnetic magnet material. The magnet material may have a magnetic polarization, such as a magnetization, such that a dipole is provided.

For example, the hard-magnetic magnet material may have a coercive field strength greater than about 500 kilo-amperes per meter (kA/m), such as greater than about 1000 kA/m. The hard magnetic magnet material may, for example, be part of or form part of one or more than one permanent magnet (also referred to as a constant magnet). A permanent magnet (also referred to as a constant magnetic pole body) may be understood to be a body of a hard-magnetic magnet material. The hard-magnetic magnet material may, for example, comprise a chemical compound and/or an alloy.

For example, the hard magnetic magnet material may comprise the elements iron, cobalt, and/or nickel (e.g., a ferrite). The hard magnetic magnet material may comprise or be formed from a rare earth metal (such as neodymium, samarium, praseodymium, dysprosium, terbium, and/or gadolinium), iron, cobalt, and/or nickel. For example, the hard-magnetic magnet material may comprise or be formed from at least neodymium, iron, and/or boron, e.g., a chemical compound thereof. Alternatively or additionally, the hard magnetic magnet material may comprise or be formed from at least aluminum, nickel, and/or cobalt, e.g., a chemical compound thereof. Alternatively or additionally, the hard magnetic magnet material may comprise or be formed from at least samarium and/or cobalt, e.g. a chemical compound thereof.

For example, the hard magnetic magnet material may comprise or be formed from neodymium-iron-boron ($Nd_2Fe_{14}B$) or samarium-cobalt ($SmCo_5$ and $Sm_2Co_{17}$). More generally, the hard magnetic magnet material (e.g., the or each permanent magnet) may comprise or be formed from a rare earth magnet material (such as neodymium-iron-boron (NdFeB) or samarium-cobalt (SmCo)), a ferrite magnet material (e.g., a hard ferrite magnet material), a bismanol magnet material, and/or an aluminum-nickel-cobalt magnet material.

For example, the soft-magnetic magnet material may have a coercivity of less than about 500 kA/m, e.g., of less than about 100 kA/m, e.g., of less than about 10 kA/m, e.g., of less than about 1 kA/m. The soft magnetic magnet material may comprise or be formed from, for example, an alloy of iron, nickel, and/or cobalt, steel, a powder material, and/or a soft ferrite (e.g., comprising nickel tin and/or manganese tin).

For example, the magnetic (e.g., soft magnetic and/or hard magnetic) material may have a magnetic permeability of about 10 or more, e.g., about 100 or more, e.g., about $10^3$ or more, e.g., about $10^4$ or more, e.g., about $10^5$ or more.

In general, the outer pole and the inner pole may be at a separation from each other and/or differ from each other in their magnetization direction and/or in their number of magnets. In the simplest case, the magnetization directions of the outer pole and inner pole are exactly opposite, e.g., antiparallel. However, in more complex implementations, they may be skewed with respect to each other, e.g., including an angle (also referred to as magnetization deviation). For example, the magnetization deviation may be about 90° or more (e.g., 120° or more, e.g., 150° or more, e.g., 160° or more, e.g., 170° or more, e.g., about 180°).

In an exemplary implementation, the inner pole may be magnetized toward and/or away from the target material on a (e.g., magnetic) magnet carrier (also called a magnet holder), and the outer pole may be magnetized away from the (e.g., magnetic) magnet carrier/holder and/or toward the target material. Alternatively, the outer pole may be magnetized toward and/or away from the (e.g., magnetic) magnet carrier/holder and the inner pole may be magnetized away from the (e.g., magnetic) magnet carrier/holder and/or toward the target material. In an exemplary implementation, the outer pole and the inner pole, e.g., their magnetization directions, may be configured (e.g., aligned and/or arranged) such that they provide (optionally together with the magnetic material in the environment), a tunnel-like to parallel magnetic field line path to the target surface.

A magnet may be understood herein as an exemplary pole body comprising a magnetized material having a magnetization and being illustratively configured as a permanent magnet. For example, the magnet may comprise a rare earth magnet (such as neodymium-iron-boron (NdFeB)) or samarium-cobalt (SmCo)), a ferrite magnet, a bismanol magnet, and/or an aluminum-nickel-cobalt magnet. What is described herein with respect to magnets may apply by analogy to pole bodies of other types.

The magnet system (e.g., its magnet bar) may optionally comprise a plurality of sequentially arranged and/or spatially separated (e.g., multi-pole) segments (also referred to as magnet system segment or as magnet system group), of which two segments (also referred to as reversing segments or end pieces) are arranged at the end faces (illustratively at the magnet system end) of the magnet system and of which one or more than one optional segment (also referred to as center piece) is arranged between the end pieces. For example, in each center piece, the circulatory path may have two rectilinear sections between which the inner pole is disposed. In each of the end pieces, the circulatory path may be arcuate and/or angled. Reference is made herein, by way of example, to a magnet system having a plurality of magnet system groups, although what is described with respect thereto may also apply to an unsegmented magnet system, or what is described with respect to one magnet system group may apply by analogy to a plurality of magnet system groups, and vice versa.

The term "non-magnetic" may be understood to mean substantially magnetically neutral, e.g., also slightly paramagnetic or diamagnetic. For example, the term "non-magnetic" may be understood as having a magnetic permeability of substantially 1, i.e. in a range of about 0.9 to about 1.1. Examples of a non-magnetic material include: Graphite, aluminum, platinum, copper, aluminum, non-magnetic stainless steel, a ceramic (e.g., an oxide).

FIG. 1 illustrates a magnet system 100 according to various embodiments in a schematic detailed view, e.g., looking at the direction 101 (also referred to as reference direction 101) along which the magnet system 100 is longitudinally extended.

The magnet system 100 may include a plurality of magnets 104 and a carrier 160 configured to support the magnets 104 of the magnet system 100. The support structure 160 may include at least one (i.e., one or more than one) carrier 102, 202 (also referred to as a magnet carrier or magnet holder), a first carrier 102 (also referred to as a first magnet carrier/holder or system carrier) of which is configured to support one or more than one magnet system group 150 of the magnet system 100 (e.g., magnets 104 thereof).

For example, the magnet system 100 may have one or more than one magnet system group 150 per system support 102, e.g., may have a plurality of magnet system groups 150 per system support 102. For example, the magnet system 100 may have (e.g., per system support 102) 2 magnet system groups 150 or more, e.g., may have 3 magnet system groups 150 or more.

Each magnet system group 150 may include a plurality (e.g., three or more) of magnets 104 and may optionally be configured to be adjustable. For example, a magnet 104 of a magnet system group 150 may have a magnetization, e.g., either with a direction (also referred to as a magnetization direction) toward or away from the system support 102. At least two magnets 104 per magnet system group 150 may differ in their magnetization direction.

Examples of components or implementations of the system support 102 include: a tube (e.g., a lance tube), a plate (e.g., a sheet), a section member, or the like. For example, the system support 102 may comprise or consist of a sectional support, e.g., comprising a U-section, e.g., comprising a double U-section (also referred to as an H-section).

Each adjustably configured magnet system group 150 may include an adjustment device 150s, for example, disposed (e.g., partially) between the system support 102 and the magnet(s) 104 of the magnet system group 150. The adjustment device 150s may be configured to change a spatial distribution of the magnetic field 120 generated by the magnet system group 150, for example by changing a spatial distribution (e.g., position and/or orientation) of the magnet(s) 104 of the magnet system group 150.

For example, the adjustment device 150s may be a component of the support structure 160 and configured to change the spatial position and/or orientation of at least one magnet of the magnet system 100.

Exemplary components of the adjustment device 150s include: a bearing device 116 (also referred to as a group bearing device) and/or an actuator 106. The adjustment device 150s (e.g., its group bearing device 116 and/or actuator 106) may couple the or each magnet 104 of the magnet system group 150 to the system support 102.

If one or more than one magnet system group 150 of the magnet system 100 is configured to be adjustable, or if the magnet system 100 comprises one or more than one adjustment device 150s, the support structure 160 may comprise, e.g. per magnet system group 150, a second carrier 202 (also referred to as a second magnet carrier/holder or as a group carrier) configured to support the plurality of magnets 104 (cf. also FIG. 2) of the magnet system group 150. In that case, the or each group carrier 202 may be magnetic (then providing the so-called return carrier) and the system carrier 102 may be non-magnetic. If the magnet system 100 does not have a group carrier 202, the system carrier 102 may be magnetic (then providing the so-called return carrier). In some embodiments, the return carrier may be plate-shaped or include at least one plate (then also referred to as a return plate).

The group bearing device 116 may provide the magnets 104 with one or more than one translational degrees of freedom 111, of which a first translational degree of freedom 111 may be along the reference direction 101 and/or one or more than one second translational degrees of freedom may be transverse to the reference direction 101.

The actuator 106 may be configured to mechanically move the magnets 104 according to the or each translational degree of freedom 111 (also referred to as actuation). To this end, the actuator 106 may be coupled to the magnet 104 and the system support 102 such that when the actuator 106 is actuated, an attitude (i.e., orientation and/or position) of the magnet 104 relative to the system support 102 may be changed, e.g., according to a desired state.

To generate the motion, the actuator 106 may include an electromechanical transducer (e.g., an electric motor or piezoelectric actuator). The electromechanical transducer may be configured to generate translational motion (e.g., in the case of a linear electric motor) or to generate rotational motion (e.g., in the case of a rotary electric motor). To transmit motion to the magnets 104, the actuator 106 may optionally include a gearbox (also referred to as an actuator).

To supply electrical power (also referred to as supply power) to the actuator 106 and/or to supply a control signal to the actuator 106, the actuator 106 may be coupled to one or more than one electrical line 108. In principle, the control signal and the supply power may be supplied together via one line 108. However, they may also be supplied via separate lines 108.

For example, the or each magnet system group 150 of the magnet system 100 may include a plurality of magnets 104, e.g., per actuator 106. For example, the magnet system group 150 may include (e.g., per actuator 106) at least three magnets 104 or more, e.g., at least six magnets 104 or more, e.g., at least 9 magnets 104 or more, e.g., at least 12 magnets 104 or more, e.g., at least 15 magnets 104 or more, e.g., at least 21 magnets 104 or more, e.g., at least 30 magnets 104 or more.

Figure 2:
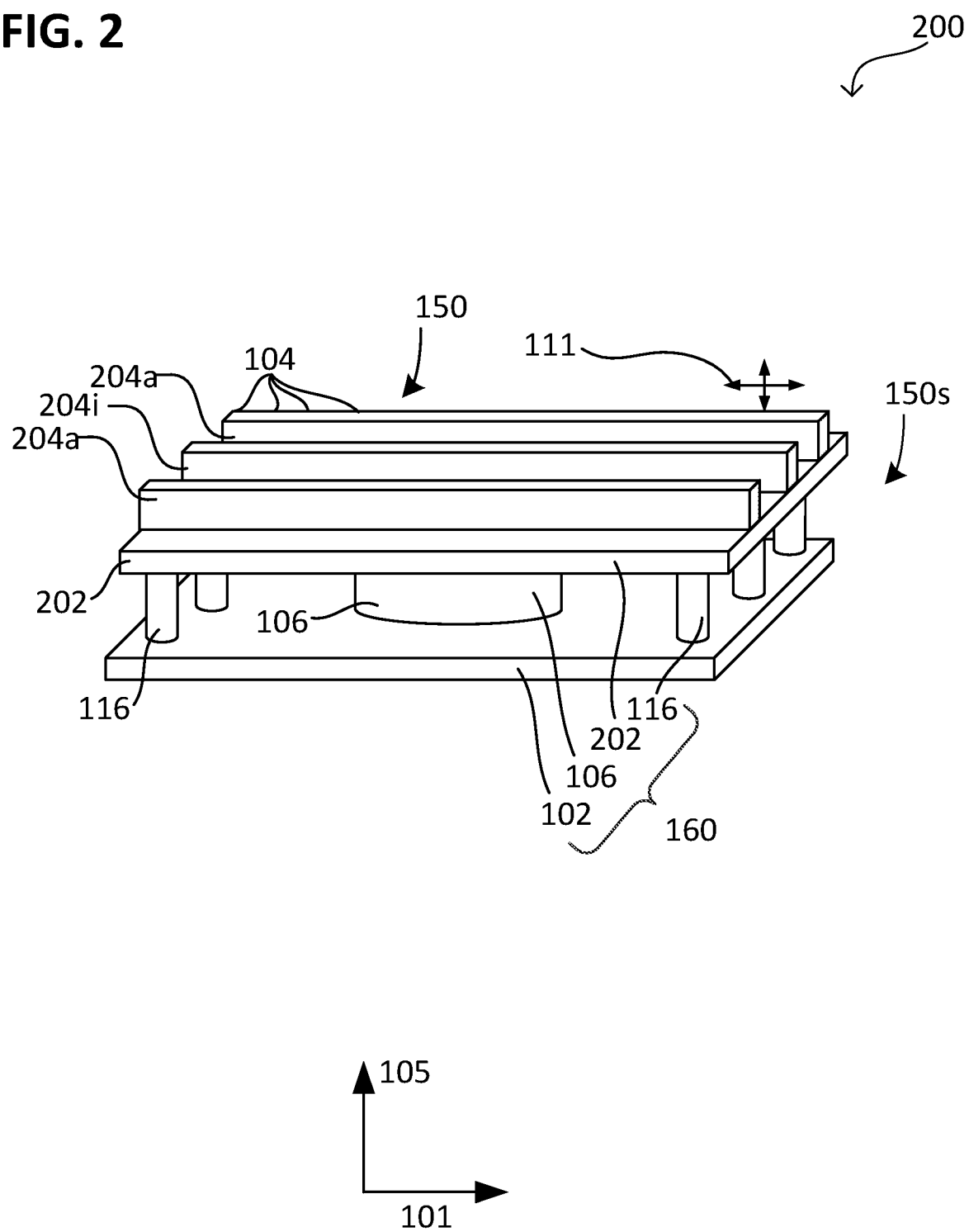

FIG. 2 illustrates the magnet system 100 according to various embodiments 200 in a schematic perspective view.

According to various embodiments, the magnet system 100, e.g., each of its magnet system groups 150, may comprise a plurality of magnet rows 204a, 204i, e.g., three magnet rows arranged in rows and spatially separated from each other, which are mounted on (e.g., magnetically coupled to) a common group carrier 202. Each of the magnet rows 204a, 204i may have a plurality of magnets of one magnetization direction arranged in series. The magnets may be arranged and aligned such that the adjacent rows of magnets 204a, 204i have opposite magnetization directions with respect to each other. For example, the outer two rows of magnets 204a may be magnetized away from the system support 102, where the centrally disposed row of magnets 204i may be magnetized toward the system support 102 (or vice versa).

At least the middle magnet row 204, which is arranged between two outer magnet rows 204, may be longitudinally extended in direction 101. Alternatively or additionally, a gap extending longitudinally in direction 101 (also referred to as direction 101 of the longitudinal extension) may be arranged between two directly adjacent magnet rows 204, which separates them spatially from each other.

Figure 3A:
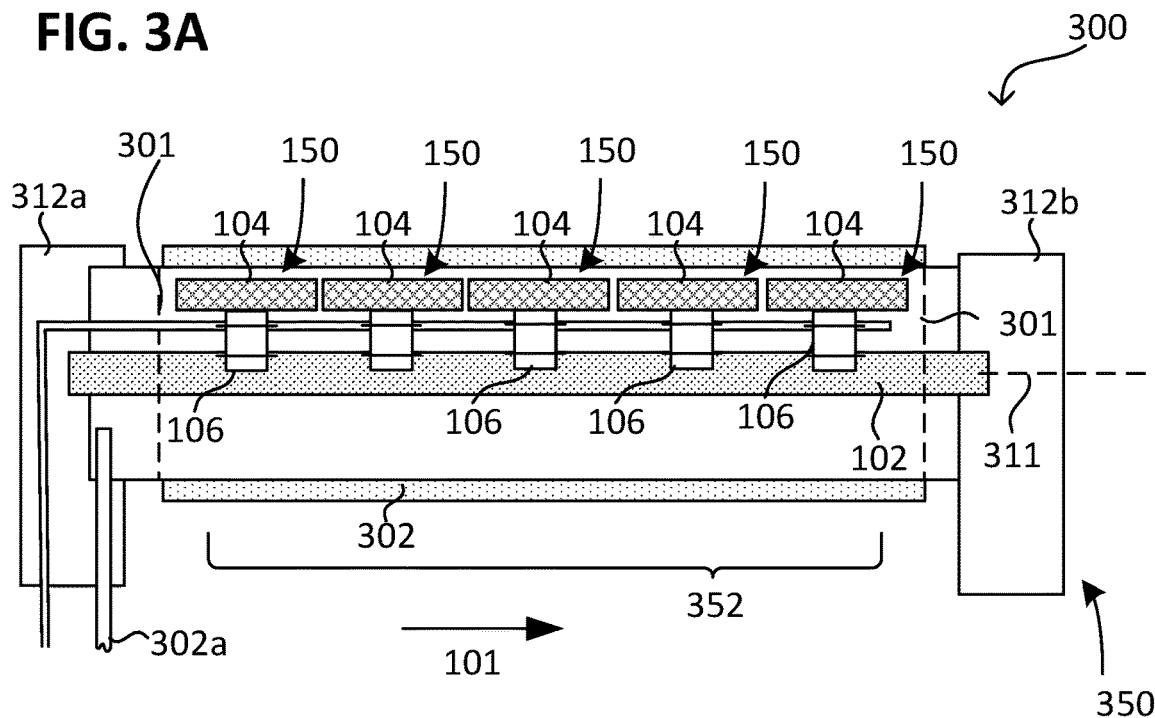
FIG. 3A shows a sputtering device according to various embodiments.
Figure 3B:
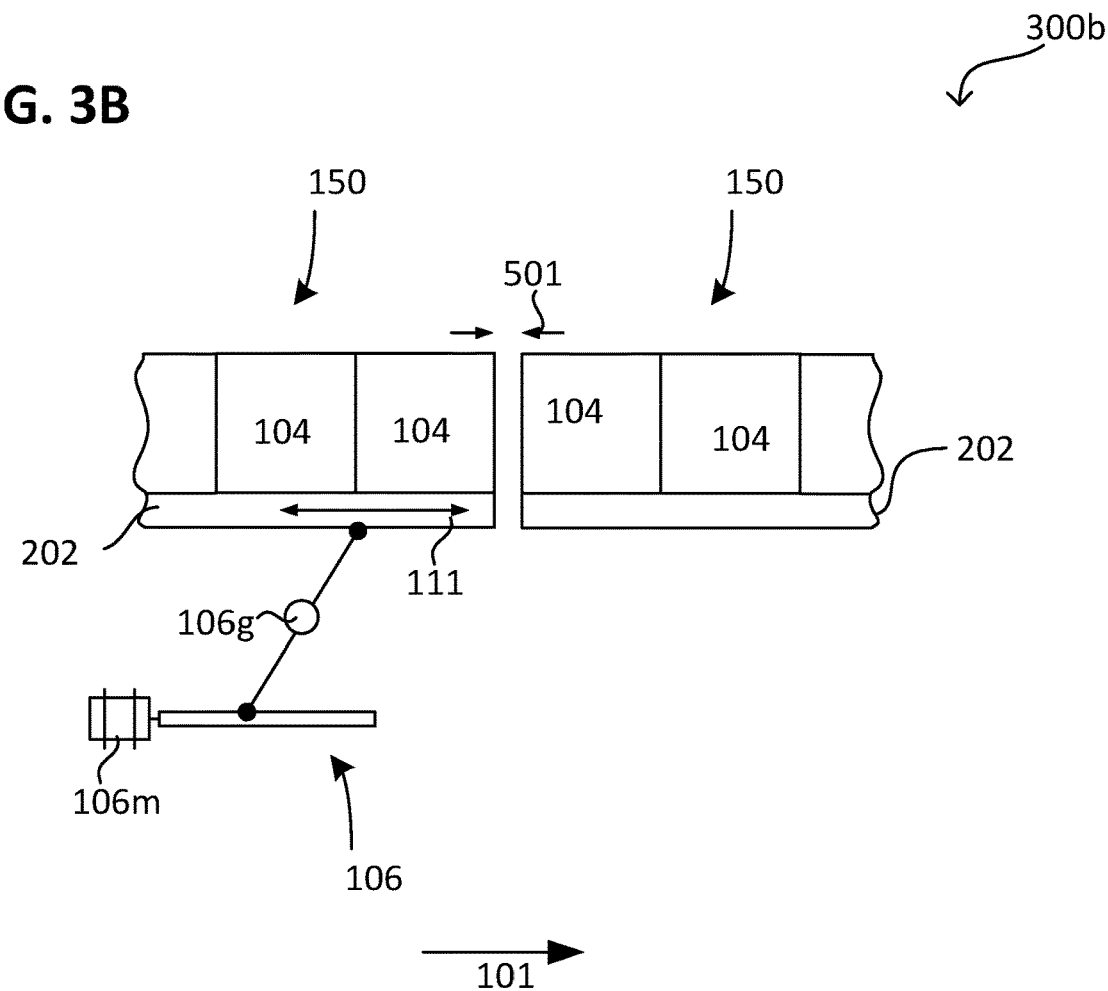
FIG. 3B shows a magnet system of the sputtering device.

FIG. 3A illustrates a sputtering device 300 according to various embodiments in a schematic side view or cross-sectional view, and FIG. 3B illustrates the magnet system 100 of the sputtering device 300 in a schematic detailed view 300b.

The sputtering device 300 may include a bearing device 350 (also referred to as a target bearing device) for rotatably supporting a tubular target 302 (also referred to as a tube target). The target bearing device 350 may include one or two end blocks 312a, 312b, wherein the tubular target 302 may be rotatably supported by means of the end blocks 312a, 312b, for example about an axis of rotation 311. To this end, the target bearing device 350 (e.g., each end block 312a, 312b) may include one or more than one corresponding pivot bearing. Per pivot bearing, for example, a target coupling 301 (e.g., comprising a flange) may be rotatably supported to which the tubular target 302 may be coupled. The axis of rotation 311 may be along direction 101.

A first end block 312a of the target bearing device 350 may be configured as a drive end block 312a, i.e., having a drive train 302a for rotating the tubular target 302. A second end block 312b of the target bearing device 350 or the first end block 312a may be configured as a media end block 312b, i.e., for supplying and discharging a cooling fluid (e.g., comprising water) and/or for supplying electrical power to the tubular cathode 302. The cooling fluid may be directed through the tubular target 302.

The drive train 302a may be coupled to or include a drive device (e.g., a motor) disposed outside of the drive end block 312a. By means of the drive train 302a, torque may be coupled to the tubular target 302 for driving rotational movement of the tubular target 302.

Further, the sputtering device 300 may include the magnet system 100 held by means of the bearing device 350, e.g., stationary and/or rotationally fixed. For example, the magnet system 100 may remain in a fixed orientation with respect to the bearing device 350 as the tubular target 302 rotates (around the system support 102). The axis of rotation 311 or direction 101 may be parallel to a longitudinal extent of the system support 102. The axis of rotation 311 may optionally be disposed within the magnet system 100.

The bearing device 350 may comprise a target coupling 301 per end block 312a, 312b by means of which the tubular target 302 may be coupled, e.g. to the drive train 302a and/or to the cooling fluid supply (e.g. comprising one or more than one fluid line). For example, the target coupling 301 may include a releasable connection that may allow mounting and dismounting of the tubular target 302.

Detail 300b illustrates an exemplary pair of magnet system assemblies 150, each magnet system assembly comprising an assembly support 202; a plurality of magnets 104 coupled together (e.g., magnetically) by the assembly support 202; and an electrical actuator 106 configured to adjust the position of the assembly supports 202 and/or the magnets 104 relative to the system support 102 and/or relative to each other in response to the electrical control signal provided to the actuator 106. For example, the actuator 106 may be configured to impart translational motion (e.g., along or across direction 101) to one of the two magnet system assemblies 150. The actuator 106 includes, for example, an electric motor 106m and an optional gearbox 106g. The gearbox 106g may couple the motor 106m to the group support 202.

Figure 4:
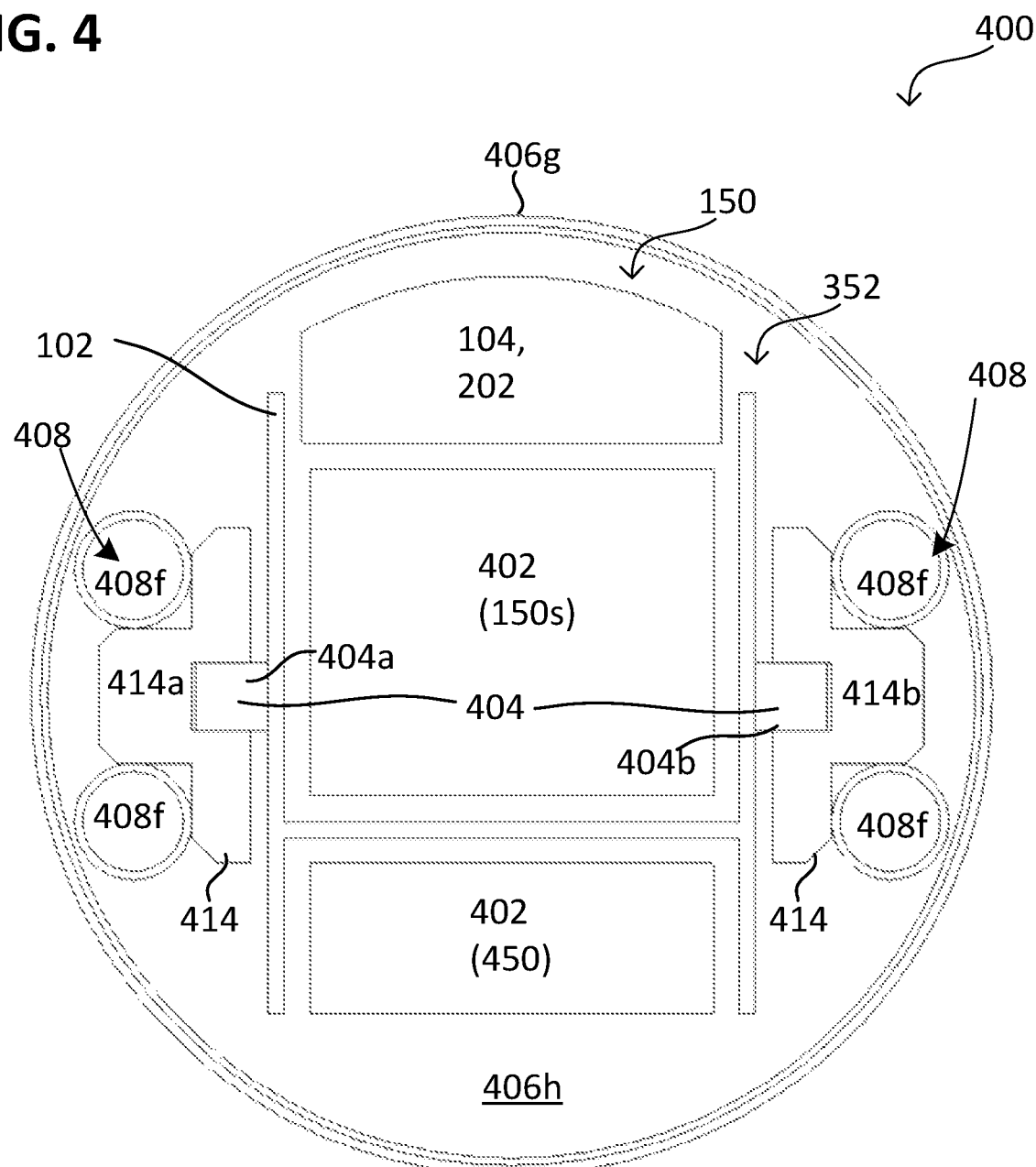
Figure 4:
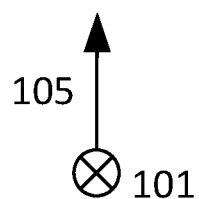

FIG. 4 illustrates the magnet system 100 according to various embodiments 400 in a schematic side view or cross-sectional view (looking along the reference direction), in which the magnet system 100 includes a longitudinally extending magnet bar 352 (also referred to as a magnet beam).

The magnet bar 352 includes the support structure 160 and the plurality of magnets 104, for example, the system support 102 and a magnet system group 150 or a plurality of magnet system groups 150 arranged in series (arranged along the longitudinal extent of the magnet bar 352 or the axis of rotation 311).

As explained above, the system support 102 may comprise or consist of a profile support, for example with a U-profile, e.g. (as shown) a double U-profile (also referred to as H-profile), or the like. The U-section (or double U-section) allows for high stability while providing sufficient installation space for one or more than one additional component 402 of the magnet system 100.

Examples of the additional component 402 of the solenoid system 100 include: the actuator 150s or at least its actuator 106 and/or group bearing device 116, an electrical component 450 (e.g., a processor or other circuit, a generator, an inverter, or the like).

Figure 9:
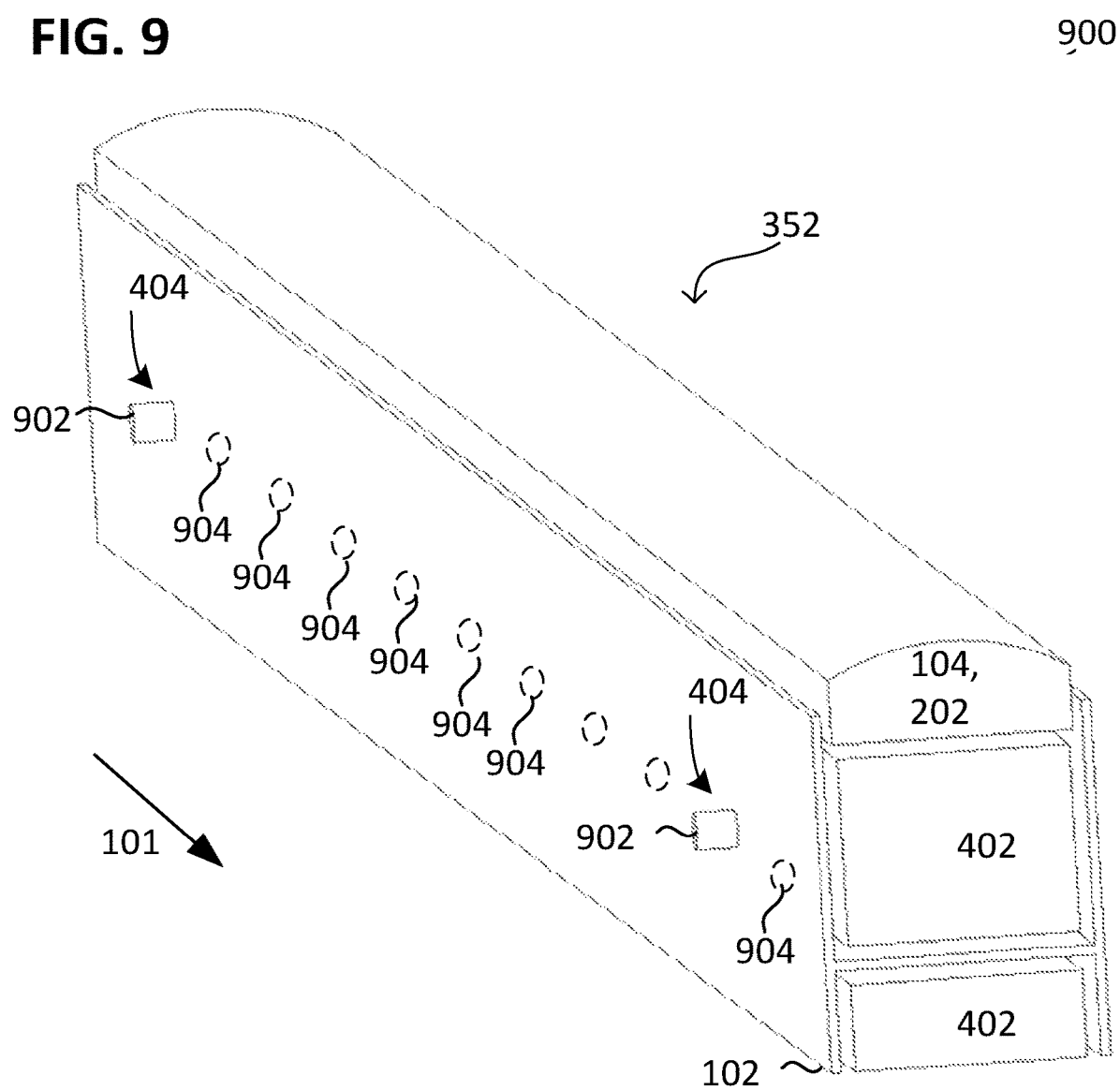

In some, but not necessarily all, embodiments, the magnet system 100 includes a base frame 414 (also referred to as a bearing frame 414) and one or more than one support device 404, e.g., a first support device 404 and a second support device 404 (see also FIG. 9).

The or each support device 404 may be mounted to the magnet bar 352 (e.g., the system support 102 thereof) and may be mated (e.g., interlocked) with the bearing frame 414 to form a bearing (e.g., floating bearing) for the magnet bar 352. For example, the bearing frame 414 and the support device 404 may be mated together to form a bearing point (e.g., a floating bearing). Optionally, the magnet bar 352 may be provided with multiple storage points (also referred to as multi-point storage) using a plurality of support devices 404 mounted to the magnet bar 352 and joined to the bearing frame 414. For example, the bearing frame 414 may include two storage components 414a, 414b (also referred to as base rack storage components) between which the magnet bar 352 is disposed, in which case the or each support device 404 includes one support component 404a, 404b per storage component 414a, 414b between which the magnet bar 352 is disposed.

In an exemplary implementation, the or each support component 404a, 404b comprises or consists of a bolt (also referred to as a bearing bolt). For example, the multi-point bearing may include one support device 404 per bearing location, each support device 404 of which includes two bearing bolts as support components 404a, 404b between which the system support 102 is disposed.

In an exemplary implementation, the bearing frame 414 may include two rails (e.g., guide rails) as base frame storage components 414a, 414b, or the base frame storage components 414a, 414b may be rail-shaped. For example, each of the guide rails may have a groove (then also referred to as a groove profile) extending along the reference direction 101 and/or along the longitudinal extent of the system support 102 (also referred to as the system support).

In some, but not necessarily all, embodiments, the magnet system 100 comprises: a housing 406g (illustratively a hollow body) having a housing interior 406h (also referred to as an inner housing) in which the magnet bar 352 is disposed, and/or a condensation trap 408. The condensation trap 408 may be adjacent to or at least partially (i.e., partially or fully) disposed within the housing interior 406h and configured to dry the housing interior 406h. For example, the condensation trap 408 may include one or more than one fluid conduit 408f, such as two or more (e.g., three, four, or more than four) fluid conduits 408f.

In an exemplary implementation, the condensation trap 408 comprises one or more than one pair of fluid lines 408f between which a base frame bearing component 414a, 414b (e.g., a guide rail) or at least a portion of the base frame bearing component 414a, 414b is disposed. Alternatively or additionally, the condensation trap 408 has one or more than one fluid conduit 408f that contacts, e.g., is optionally connected to, the base frame 414, e.g., its rack storage component(s) 414a, 414b. This increases the heat transfer between them and/or the stiffness of the bearing frame 414.

In a particularly simple and cost-effective implementation, the housing 406g is tubular (e.g., comprising a housing tube). This increases the compactness and/or rigidity of the magnet system 100.

For example, the system carrier 102 includes a carrier profile and supports each group carrier 202 (e.g., back plate 202), the magnets 104 supported by means of the group carrier 202, and the optional electrical or electronic components 402.

Figure 5:
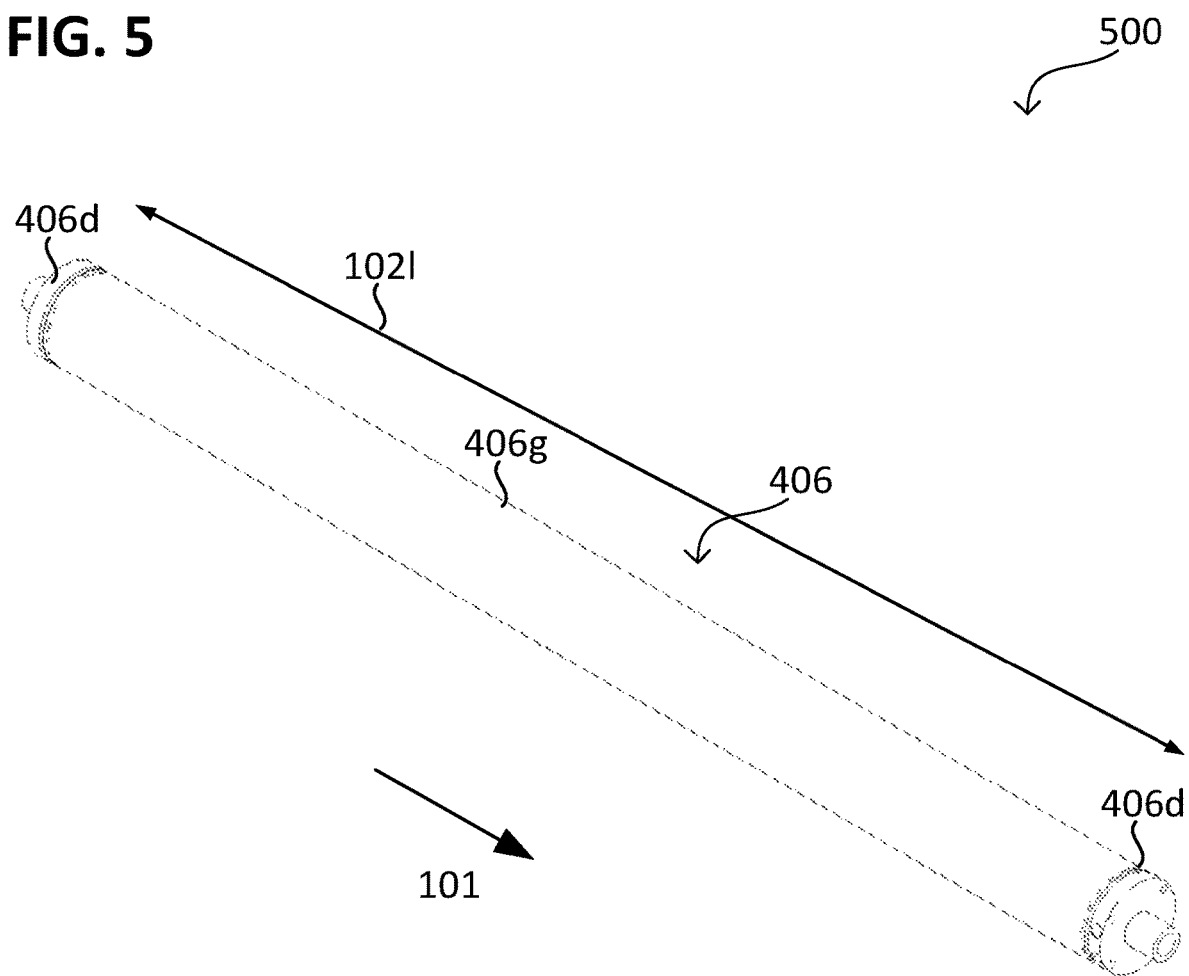

FIG. 5 illustrates the magnet system 100 according to various embodiments 500 in a schematic side view or cross-sectional view, in which the magnet system 100 comprises a (e.g., fluid-tight, e.g., vacuum-tight) chamber 406 (also referred to as a system chamber 406) comprising the housing 406g and one or more than one cover 406d (also referred to as a connector cover 406d or housing cover). The or each lid 406d may be configured to close (e.g., fluid-tight, e.g., vacuum-tight) the housing 406g end-to-end (e.g., from or in the direction of the longitudinal extent of the magnet bar 352 or axis of rotation 311). Optionally, at least one connection lid 406d of the system chamber 406 may be configured to supply the or each magnet system group 150 of the magnet system 100 (then also referred to as a supply lid), e.g., with mechanical energy and/or electrical energy. To this end, the supply cover 406d may include a gear stage, a generator, a communication interface, and/or a rotary coupling (e.g., a rotor through-coupling or a rotary union).

Figure 6:
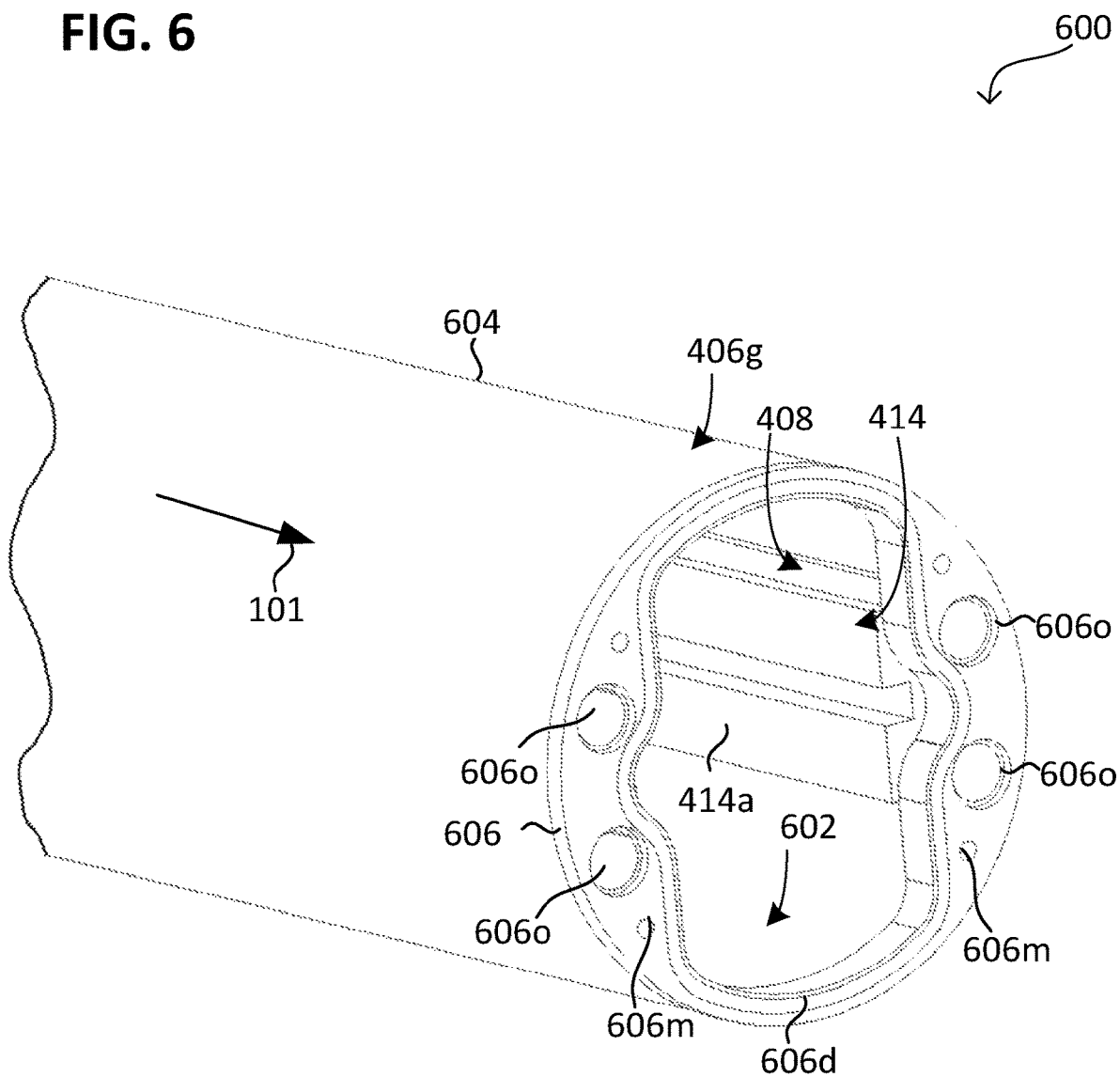

FIG. 6 illustrates the magnet system 100 according to various embodiments 600 in a schematic perspective view looking at a front face of the housing 406g. The housing 406g may have one or more than one opening 602 (also referred to as housing opening 602) on the front side, which exposes the housing interior 406h and may be covered by means of the optional connection cover 406d if required. The housing 406g may be supported by means of the target bearing device 350, e.g., disposed or received between the bearing points thereof (e.g., the end blocks 312a, 312b).

For example, the system support 102 may be point supported in the housing 406g by means of the bearing frame 414, e.g., by means of a plurality of bearing points (also referred to as multi-point bearings), which facilitates adjusting the deformation (e.g., gravitational deflection) of the system support to be only slightly dependent on the deformation (e.g., gravitational deflection) of the housing 406g.

For example, the multipoint bearing may have at least two bearing locations or more, such as at least three bearing locations or more, such as at least 4 bearing locations or more.

In an exemplary implementation, the housing 406g comprises a rigid housing, allowing for a low-cost and particularly stable implementation. In an alternative or additional exemplary implementation thereto, one or more than one base frame bearing component 414a, 414b of the bearing frame 414 comprises the groove (then also referred to as groove profile) extending along the reference direction 101 and/or along the longitudinal extension of the system support 102 (also referred to as system support), in which, for example, a support device 404 engages. This facilitates the adjustment of the multi-point bearing.

In an exemplary implementation, the tubular housing 406g comprises a tube 604 (also referred to as a housing tube 604) and one or more than one flange 606 (e.g., one flange 606 per housing opening 602), each flange 606 being water-tightly connected (e.g., welded) to an end face of the tube and/or penetrated by the housing opening 602. Each flange 606 of the housing 406g has a sealing surface 606d and one or more than one mounting area 606m (e.g., each having a thread), each mounting area 606m of which is configured to mate with a fitting cover 406d such that the fitting cover 406d may be mounted to the mounting area 606m (to axially secure the fitting covers).

Optionally, each flange 606 of the housing 406g has one or more than one port 606o (also referred to as a port opening 606o), of which a fluid line 408f (e.g., a tube) of the condensation trap 408 opens into each port opening 606o. For example, the housing 406g may include two or more (e.g., three, four, or more than four) port openings 606o per flange 606. Each of the fluid lines 408f may be, for example, connected (e.g., welded) to the flange 606 in a watertight manner and/or coupled to the guide rail.

In the following, the multi-point bearing arrangement is explained with reference to a two-point bearing arrangement which is easy to implement in terms of design, i.e. a two-bearing system support 102. It may be understood that what is explained in this regard may apply by analogy to more than two bearing positions.

In an exemplary implementation, the magnet system 100 has a housing 406g, which is closed in a watertight manner at the end by means of two connection lids 406d. The connection lids 406d each have a bearing journal by means of which the system chamber 406 is received in an end block.

Figure 7:
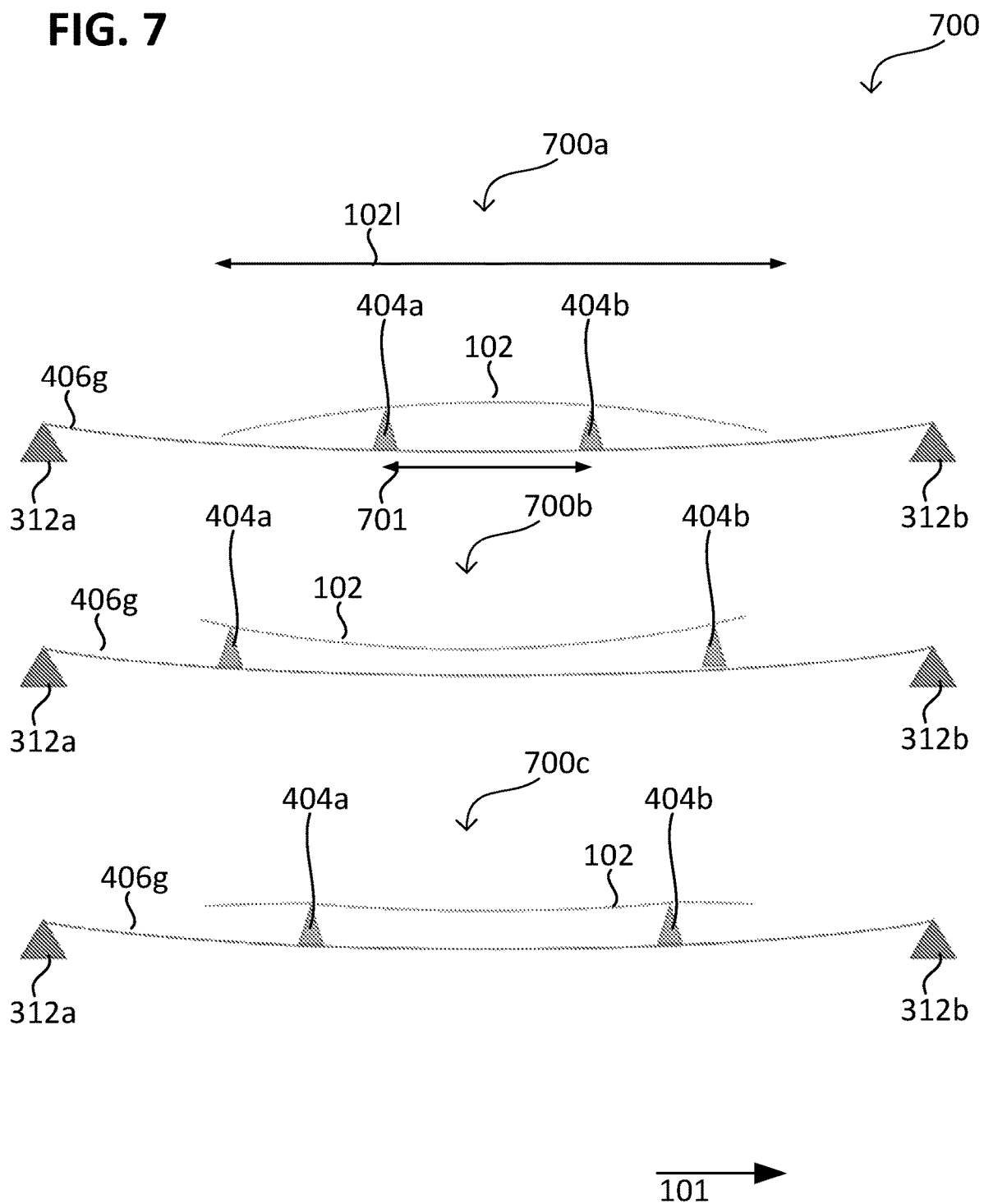

FIG. 7 illustrates the magnet system 100 according to various embodiments 700 in a schematic bearing diagram showing a plurality of configurations 700a to 700c of the magnet system 100 that differ from each other in the position (also referred to as the support position) in which the first support device 404 and the second support device 404 are mounted relative to each other on the system support 102. As an exemplary difference in support position, a difference in the separation 701 (also referred to as support separation 701) of the first support device 404 from the second support device 404 or the two bearing locations from each other is referred to below.

The system support 102 and the housing 402g are represented in the bearing diagram by schematic bending lines. The plurality of configurations 700a to 700c differ based on the difference in the support spacing in the bending line of the system support 102.

In configuration 700a, the support distance 701 is illustratively small, e.g., less than 50% of the longitudinal extent 1021 of the system support 102. In configuration 700a, the bending line of the system support 102 is opposite to the bending line of the housing 402g. In configuration 700b, the support distance 701 is illustratively large, e.g., greater than 90% of the longitudinal extent 1021 of the system support 102. In configuration 700b, the bending line of the system support 102 is equidirectional to the bending line of the housing 406g.

In configuration 700c, the support spacing 701 is illustratively set to minimize deflection of the housing 406g, for example, to a range between 50% of the longitudinal extent 1021 of the system support 102 and 90% of the longitudinal extent 1021 of the system support 102, for example, to a range between 60% of the longitudinal extent 1021 of the system support 102 and 80% of the longitudinal extent 1021 of the system support 102.

For example, in configuration 700c, the support spacing 701 may be configured such that the deflection of the system support 102 is exactly the same at the center as at the ends. In other words, they may substantially compensate for each other.

By changing the multi-point support, e.g. the support distance 701, the support position and/or the number of bearing points (or support devices 404) by means of which the system carrier 102 is supported, the deflection of the system carrier 102 may be adjusted, for example according to a preset. The preset may be, for example, a function of the deflection of the housing 406g and/or the deflection of the target 302.

For example, the multi-point bearing may be configured to achieve asymmetric deflection and/or skewing of the system support 102. Based on the influencing variables relevant for the deflection (e.g. bending rigidity and/or inherent mass), the required bearing distances for the desired deflection may be determined by a calculation of the coupled system formed of housing 406g and system support 102.

Figure 8:
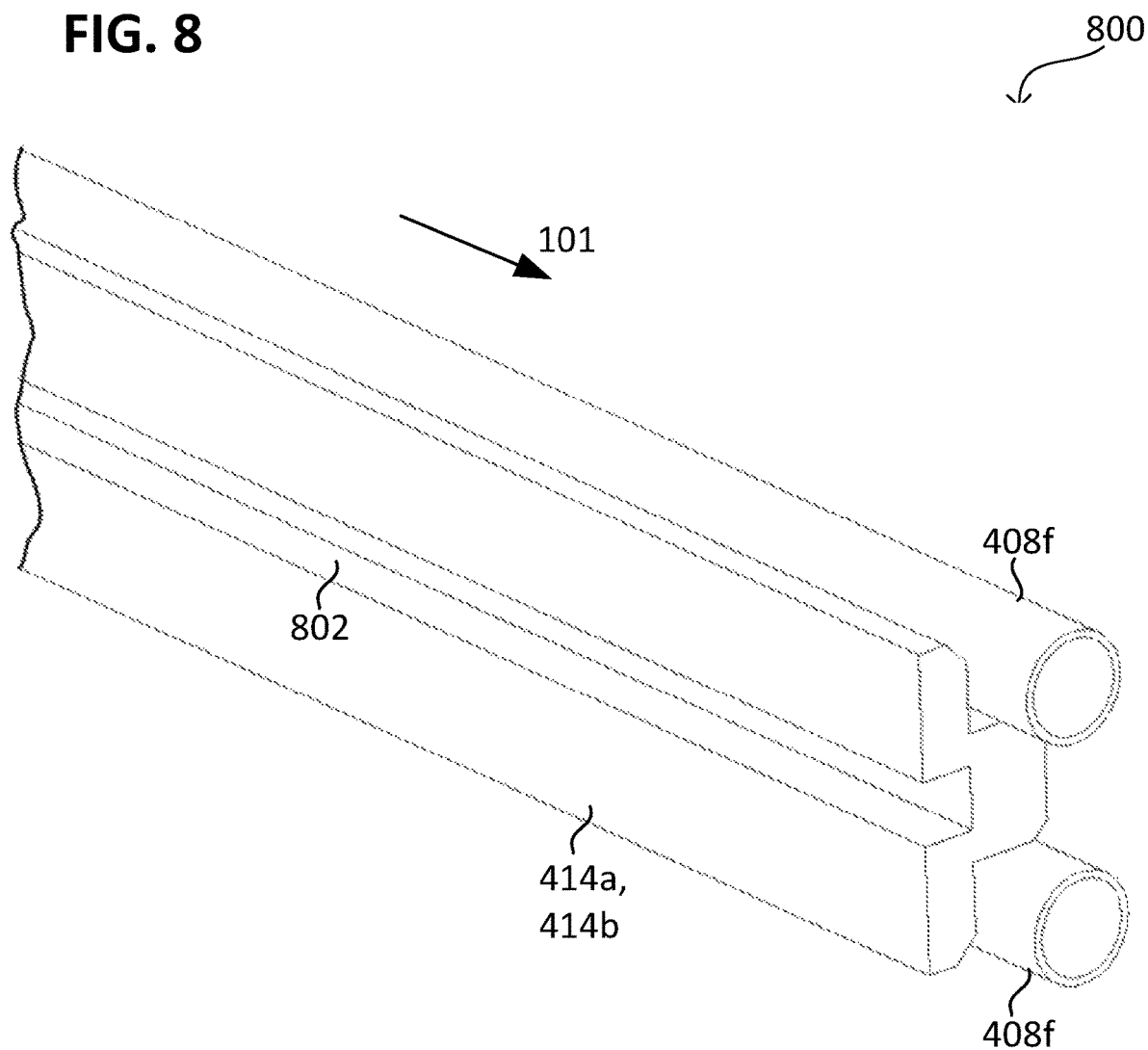

FIG. 8 illustrates the magnet system 100 according to various embodiments 800 in a schematic perspective detail view of a base frame bearing component 414a, 414b configured as a guide rail.

For example, the or each guide rail 414a, 414b has a grooved profile and/or is coupled (e.g., welded) to each fluid line (e.g., line pipe) of a pair of fluid lines 408f of the condensation trap 408. This coupling simultaneously increases the rigidity of the guide rail.

The groove profile facilitates insertion of the system support 102, on which the one or more than one support device 404 is mounted, into the housing 406g. For example, the system carrier 102 on which the one or more than one support device 404 is mounted may be inserted into the housing 406g in a face-to-face manner such that each support device 404 engages the groove of the groove profile (also referred to as a guide groove) and is slid along the groove into the housing 406g.

FIG. 9 illustrates the magnet system 100 according to various embodiments 900 in a schematic perspective detail view of a face of the magnet bar 352, in which each support device 404 has two bearing bolts 902 as support components.

The magnet system 100 may include two or more support devices 404 (e.g., one support device 404 per bearing location), each support device 404 including two bearing bolts 902 as support components between which the system support 102 is disposed. Each of the bearing bolts 902 may protrude from the system support 102.

In an exemplary implementation, the system carrier 102 to which the two or more support devices 404 are mounted is inserted into the housing 406g (e.g., its housing tube 604), e.g., by positively engaging each of the support devices 404 in the guide rail guide groove. The system support 102 is positively supported in each guide rail of the bearing frame 414 by means of the bearing pins 902.

FIG. 10 illustrates the magnet system 100 according to various embodiments 1000 in a schematic detailed view of the system support 102, which includes a plurality of mounting areas 1002a, 1002b. Each mounting area of the plurality of mounting areas 1002a, 1002b of the system support 102 may be configured such that a support device 404 may be mounted thereto. For example, each of the mounting areas 1002a, 1002b may include one or more than one form-fit profile 904 to which the support device may be positively mounted. Examples of a form-fit profile 904 include: a recess (e.g., a groove), a protrusion, a notch (e.g., a thread), a longitudinal slot (e.g., for a bayonet fitting).

For example, the plurality of mounting areas 1002a, 1002b may be arranged in series (e.g., in a row) along the reference direction 101. Alternatively or additionally, the mounting areas 1002a, 1002b may be arranged equidistantly from each other.

In an exemplary implementation, the plurality of mounting areas 1002a, 1002b may be configured the same as each other such that a support device may be remounted (i.e., swapped) from a first mounting area 1002a of the plurality of mounting areas 1002a, 1002b to a second mounting area 1002b of the plurality of mounting areas 1002a, 1002b. In other words, each of the mounting areas 1002a, 1002b of the support device may provide at least one position (also referred to as mounting positions) in which the support device may be mounted to the mounting area.

According to various embodiments, the plurality of mounting areas 1002a, 1002b may include one or more than one mounting area (also referred to as a multi-position mounting area) that provides the support device with a plurality of mounting positions in which the support device may be (illustratively optionally) mounted to the multi-position mounting area. More than two mounting positions per multi-position mounting area may, for example, be arranged equidistantly from each other, e.g. in a regular pattern (also referred to as a mounting grid), or may merge into each other.

For example, a number of mounting areas 1002a, 1002b (e.g., multi-position mounting areas) of the plurality of mounting areas 1002a, 1002b of the system carrier 102 may be greater than a number of bearing locations and/or may be greater than two or more, e.g., three, four, or more than four. Alternatively or additionally, a number of mounting positions per plurality of mounting positions mounting area of the plurality of mounting areas 1002a, 1002b of the system carrier 102 may be two or more, e.g., three, four, or more than four.

In a preferred exemplary implementation, each multi-position mounting area has two or more form-fit profiles 904 (e.g., dimples) that are arranged at a separation from each other and each of which form-fit profiles 904 provides the support device with a multi-position in which the support device may be mounted to the multi-position mounting area. In an alternative or additional implementation thereto, one or more than one form-fit profile per multi-position mounting area is configured (e.g., as an elongated hole, rail, or groove) to provide the support device therefrom a plurality of multi-positions in which the support device may be mounted to the multi-position mounting area (e.g., steplessly). For example, the form-fit profile may have two sections configured equal to each other such that the support device may be remounted from a first mounting position on a first section of the two sections to a second mounting position on a second section of the two sections.

The two or more form-fit profiles 904 may, for example, be arranged one behind the other along the reference direction 101. More than two form-fit profiles 904 may be arranged equidistantly from each other, for example, arranged in a regular pattern (also referred to as a form-fit grid). The two or more form-fit profiles 904 may be configured to be the same as each other such that the support device may be remounted from a first mounting position on a first form-fit profile 904 to a second mounting position on a second form-fit profile 904.

In an exemplary implementation of the mounting grid, the system carrier 102 provides a mounting position every 65 mm in which an (additional) bearing bolt 902 may be inserted, or a bearing bolt 902 already mounted thereto may be remounted.

In an exemplary implementation, the magnet system 100 comprises: the tubular housing 406g with the system carrier 102 arranged therein, wherein the tubular housing 406g comprises the housing tube 604 and two guide rails 414a, 414b are arranged therein, on which the system carrier 102 is supported by means of a plurality of bearing bolts 902 (e.g., two bearing bolts per bearing location). The bearing bolts 902 may, for example, be guided in the guide rails 414a, 414b arranged on both sides of the system carrier 102 along or against the reference direction 101.

As an alternative or in addition to a mounting grid for the bearing bolts, it is also possible to move the bearing bolts 902 continuously (e.g. by means of the slotted holes). However, this may make assembly more difficult, for example if the separation of the bearing bolts from each other has to be remeasured during assembly in order to position them precisely enough.

Additional exemplary implementations of various components of the magnet system 100 that facilitate design and/or assembly are explained below.

In an exemplary implementation of the support device 404 (e.g., its bearing bolts), the support device 404 comprises or consists of copper and/or tin, e.g., an alloy thereof (e.g., bronze). This is cost effective. Alternatively or additionally, the support device 404 (e.g., its bearing pin) comprises or consists of a non-magnetic material, e.g., copper, aluminum, bronze, or the like. This mitigates interference with the magnetic field.

In an exemplary implementation of the bearing frame 414 (e.g., its guide rails), this has or consists of iron, e.g., an alloy thereof (e.g., stainless steel). This is cost effective. Alternatively or additionally, the bearing frame 414 (e.g., guide rails thereof) has or consists of a non-magnetic material, e.g., non-magnetic stainless steel. This reduces disturbance of the magnetic field.

In an exemplary implementation, one or more than one support device 404 of the magnet system 100 includes a ball bearing. This facilitates insertion of the system support 102 into the housing 406g or guide rail. For example, one or more than one support device 404 of the magnet system 100 may include a ball bearing attached to (e.g., placed on) the face of the bearing pin, e.g., per bearing pin.

The use of individual bearing bolts has advantages over a bearing rail when sliding the system carrier into the housing 406g, as friction is reduced and the magnet system is not so dependent on shape and position tolerances. The guide rails offer a further advantage in that they may, for example, be connected to the housing 406g only at the end face (i.e. are mounted in a cantilevered manner). This allows the guide rails to yield somewhat during assembly or disassembly of the system support, reducing the risk of jamming.

In the following, various examples are described that relate to what has been described above and what is shown in the figures.

Example 1 is a magnet system for a sputtering device (i.e., a sputtering device magnet system), the magnet system comprising: a (e.g., non-magnetic) bearing frame; a (e.g., non-magnetic) magnet holder having a first mounting area and a second mounting area; a first (e.g. non-magnetic) support device, which is mounted to the magnet holder by means of the first mounting area; a (e.g. non-magnetic) second support device, which is mounted to the magnet holder by means of the second mounting area, wherein the first mounting area and/or the second mounting area are configured in such a way that a (spatial) position (e.g. orientation and/or distance from each other), a (spatial) position (e.g. orientation and/or distance from each other), a (spatial) position (e.g. orientation and/or distance from each other), a (spatial) position (e.g. orientation and/or distance from each other), a (spatial) position (e.g. orientation and/or distance from each other), a (spatial) position (e.g. orientation and/or distance from each other), a (spatial) position (e.g. orientation and/or separation from each other) in which the first support device and the second support device are mounted relative to each other on the magnet holder may be changed; wherein the first support device and the second support device are configured to form with the bearing frame (e.g., form-fitted) to form a bearing device (also referred to as a magnet holder bearing device), e.g., a multi-point bearing device, for bearing the magnet holder (e.g., cantilevered between the first support device and the second support device), e.g., interlocked with the bearing frame (e.g., form-fitted). For example, the bearing device may provide the magnet holder with a plurality of bearing locations (illustratively a multipoint bearing) (then also referred to as a multipoint bearing device). Between the first support device and the second support device, the magnet holder may be cantilevered, for example.

Example 2 is the magnet system according to example 1, wherein the first mounting area of the first support device provided a plurality of mounting positions (e.g., equidistant and/or arranged in a row one behind the other) in which the first support device may be mounted to the first mounting area.

Example 3 is the magnet system of example 2, wherein the plurality of mounting positions are spaced apart from each other; and/or wherein the plurality of mounting positions include a first mounting position and a second mounting position in which the first support device may be mounted to the first mounting area (e.g., optionally), the first mounting position and the second mounting position being spaced apart from each other.

Example 4 is the magnet system according to example 3, wherein the first mounting area is configured such that the first support device may be mounted to the first mounting area in any position between the plurality of mounting positions (e.g., the first mounting position and the second mounting position); and/or wherein the plurality of mounting positions are equidistantly and/or sequentially arranged.

Example 5 is the magnet system according to any of examples 1 or 4, wherein the second mounting area of the second support device provided a plurality of additional mounting positions (e.g., equidistant and/or arranged in a row one behind the other) in which the second support device may be mounted to the second mounting area.

Example 6 is the magnet system of example 5, wherein the plurality of additional mounting positions are spaced apart from each other; and/or wherein the plurality of additional mounting positions include a first additional mounting position and a second additional mounting position in which the second support device may be mounted to the second mounting area (e.g., optionally), the first additional mounting position and the second additional mounting position being spaced apart from each other.

Example 7 is the magnet system of example 6, wherein the second mounting area is configured such that the second support device may be mounted to the second mounting area in any position between the additional plurality of mounting positions (e.g., the additional first mounting position and the additional second mounting position); and/or wherein the plurality of additional mounting positions are arranged equidistantly and/or sequentially.

Example 8 is the magnet system according to any of examples 1 to 7, wherein the first support device and/or the second support device are configured to form a floating bearing (i.e., movable support) when joined together (e.g., positively) with the bearing frame.

Example 9 is the magnet system according to any one of examples 1 to 8, wherein the first support device and the second support device are configured identically to each other such that they may be mounted interchangeably with each other.

Example 10 is the magnet system according to any of examples 1 to 9, wherein the first support device and/or the second support device comprise two support components between which the magnet holder is arranged.

Example 11 is the magnet system according to any one of examples 1 to 10, further comprising: a plurality of magnets arranged in series supported by means of the magnet holder, the plurality of magnets arranged in series preferably providing a plurality of rows of magnets arranged side by side and/or at least two magnetic poles (e.g., an inner pole and an outer pole surrounding the inner pole).

Example 12 is the magnet system according to any one of examples 1 to 11, wherein the first support device and/or the second support device comprise a ball bearing, preferably wherein the first support device and/or the second support device comprise a bolt to which the ball bearing is attached.

Example 13 is the magnet system according to any of examples 1 to 12, wherein the bearing frame (e.g. each guide rail thereof) comprises a (e.g. longitudinal) groove or groove profile into which the first support device and/or the second support device engages.

Example 14 is the magnet system according to any one of examples 1 to 13, wherein the first mounting area and/or the second mounting area includes a plurality of openings arranged in a grid.

Example 15 is the magnet system according to any one of examples 1 to 14, wherein the first mounting area comprises a first grid according to which the first support device may be mounted to the magnet holder; and/or wherein the second mounting area comprises a second grid according to which the second support device may be mounted to the magnet holder; the first grid and the second grid preferably being configured identically.

Example 16 is the magnet system according to any one of examples 1 to 15, wherein the first support device and the second support device are interchangeably mountable to the magnet holder.

Example 17 is the magnet system according to any one of examples 1 to 16, wherein the bearing frame comprises one or more than one guide rail in which the first support device and/or the second support device engage.

Example 18 is the magnet system according to any of examples 1 to 17, wherein the bearing frame and the first support device and/or the second support device are positively engaged.

Example 19 is the magnet system according to any of examples 1 to 18, wherein the bearing frame has greater bending rigidity than the magnet holder.

Example 20 is the magnet system according to any of examples 1 to 19, wherein the first support device and/or the second support device comprise one or more than one protrusion, preferably one or more than one stud.

Example 21 is the magnet system according to any of examples 1 to 20, wherein the first support device and/or the second support device comprise two bolts between which the magnet holder is arranged.

Example 22 is the magnet system according to any one of examples 1 to 21, further comprising: a housing, preferably tubular, in which the bearing frame is disposed; wherein the bearing frame is preferably fixedly (e.g., rigidly) coupled to the housing therewith; and/or wherein the housing has a greater bending rigidity than the magnet holder and/or than the bearing frame.

Example 23 is the magnet system of example 22, wherein the housing includes an opening (e.g., housing opening) through which the magnet holder may be inserted into the housing when engaged with the bearing frame; and/or wherein a fluid conduit is disposed in the housing.

Example 24 is the magnet system according to any one of examples 1 to 23, further comprising: a plurality of magnets held by means of the magnet holder.

Example 25 is the magnet system of example 24, further comprising a plurality of assemblies, each assembly comprising: at least one magnet of the plurality of magnets; an actuator by means of which the at least one magnet is coupled to the magnet holder, the actuator configured to be driven in response to change a spatial relationship of the at least one magnet relative to the magnet holder.

Example 26 is a sputtering device comprising: a bearing device, preferably comprising one or more than one end block, providing an axis of rotation for rotatably supporting a sputtering target; and the magnet system according to any one of examples 1 to 25 being supported by the bearing device stationary relative to the axis of rotation and/or to the bearing device (e.g. within the sputtering target).

Example 27 is a sputtering device according to example 26, the bearing device further comprising: a fixed bearing supporting the magnet system and/or a rotary bearing for rotatably supporting the sputtering target.

Example 28 is the sputtering device of example 27, the bearing device further comprising: a coupling rotatably supported by means of the pivot bearing for coupling the sputtering target, the coupling having a through-hole exposing the fixed bearing and/or into which the fixed bearing extends.

The invention claimed is:

1. A magnet system for a sputtering device, the magnet system comprising:
    a bearing frame;
    a magnet holder comprising a first mounting area and a second mounting area;
    a first support device mounted to the magnet holder by means of the first mounting area;
    a second support device mounted to the magnet holder by means of the second mounting area, wherein at least one of the first mounting area and the second mounting area is configured such that mounting positions at which the first support device and the second support device are mounted to the magnet holder are movable relative to each other, wherein the first support device and the second support device are configured to form, when assembled with the bearing frame, a bearing device for storing the magnet holder.

2. The magnet system of claim 1, wherein the first mounting area of the first support device provides a plurality of first mounting positions at which the first support device may be mounted to the first mounting area.

3. The magnet system of claim 2, wherein the plurality of first mounting positions are spaced apart from each other, wherein the plurality of first mounting positions comprise a first mounting position and a second mounting position at which the first support device may be mounted to the first mounting area, wherein the first mounting position and the second mounting position are spaced apart from each other.

4. The magnet system of claim 2, wherein the first mounting area is configured such that the first support device may be mounted to the first mounting area in any position between the plurality of first mounting positions.

5. The magnet system of claim 2, wherein the plurality of first mounting positions are arranged equidistantly or consecutively.

6. The magnet system of claim 1, wherein the first support device and the second support device are configured identically to each other such that they may be mounted interchangeably with each other.

7. The magnet system of claim 1, further comprising a plurality of magnets arranged in series supported by the magnet holder.

8. The magnet system of claim 7, wherein the plurality of magnets from a plurality of rows of magnets arranged side by side.

9. The magnet system of claim 1, wherein the first support device or the second support device comprise a ball bearing configured to provide a translational movement of the first support device or the second support device relative to the bearing frame.

10. The magnet system of claim 9, wherein the first support device or the second support device comprises a bolt to which the ball bearing is attached.

11. The magnet system of claim 1, wherein the bearing frame comprises a continuous guide rail in which the first support device or the second support device engages.

12. The magnet system of claim 11, wherein the guide rail comprises a continuous groove into which the first support device or the second support device engages.

13. The magnet system of claim 1, wherein the bearing frame has greater bending rigidity than the magnet holder.

14. The magnet system of claim 1, the magnet system further comprising a housing in which the bearing frame is arranged, wherein the bearing frame is stationarily coupled to the housing.

15. The magnet system of claim 1, wherein the housing is a tubular housing.

16. A sputtering device, comprising:
    a target bearing device comprising one or more than one end block, which provides an axis of rotation for rotatably supporting a sputtering target;
    a magnet system attached to the target bearing device, stationary relative to the axis of rotation, the magnet system comprising:
    a bearing frame;
    a magnet holder having a first mounting area and a second mounting area;
    a first support device mounted to the magnet holder by means of the first mounting area; and
    a second support device mounted to the magnet holder by means of the second mounting area, wherein at least one of the first mounting area and the second mounting area is configured such that mounting positions at which the first support device and the second support device are mounted to the magnet holder are movable relative to each other, wherein the first support device and the second support device are configured to form, when assembled with the bearing frame, a bearing device for storing the magnet holder.

17. The sputtering device of claim 16, wherein the first support device and/or the second support device are configured to form a floating bearing when joined together with the bearing frame.

18. The sputtering device of claim 16, wherein the bearing frame and the first support device and/or the second support device are positively engaged.

19. The sputtering device of claim 16, wherein the bearing frame has greater bending rigidity than the magnet holder.

20. The sputtering device of claim 16, wherein the first support device and the second support device comprise two bolts between which the magnet holder is arranged.

* * * * *